(12) United States Patent
Araki

(10) Patent No.: US 6,841,887 B2
(45) Date of Patent: Jan. 11, 2005

(54) SEMICONDUCTOR CHIP SOLDERING LAND PATTERN

(75) Inventor: Chihiro Araki, Shuuchi-gun (JP)

(73) Assignee: Kabushiki Kaisha Moric, Mori-machi (JP)

(*) Notice: Subject to any disclaimer, the term of this patent is extended or adjusted under 35 U.S.C. 154(b) by 263 days.

(21) Appl. No.: 10/063,854

(22) Filed: May 20, 2002

(65) Prior Publication Data

US 2002/0179327 A1 Dec. 5, 2002

(30) Foreign Application Priority Data

May 30, 2001 (JP) ........................................ 2001-161737

(51) Int. Cl.[7] .............................................. H01L 23/48
(52) U.S. Cl. ........................ 257/782; 257/786; 257/787
(58) Field of Search ................................ 257/773, 779, 257/782, 786, 787; 438/125–126

(56) References Cited

U.S. PATENT DOCUMENTS

| | | | | |
|---|---|---|---|---|
| 5,668,406 A | * | 9/1997 | Egawa | 257/690 |
| 5,708,567 A | * | 1/1998 | Shim et al. | 361/723 |
| 5,889,324 A | * | 3/1999 | Suzuki | 257/712 |
| 6,525,418 B2 | * | 2/2003 | Araki | 257/707 |

* cited by examiner

Primary Examiner—Alonzo Chambliss
(74) Attorney, Agent, or Firm—Ernest A. Beutler

(57) ABSTRACT

A semiconductor chip mounted on a substrate having a soldering land pattern for containing a molten solder interposed between said conductive surface and a facing surface of the semiconductor chip. The soldering land pattern comprises corners spaced respectively from the four corners of the semiconductor chip bottom surface and escapes formed between the corners sufficiently outside of the respective sides of the semiconductor chip bottom surface to accept liquid solder displaced from the area between the conductive surface and the facing surface of the semiconductor chip upon placing the semiconductor chip within the soldering land pattern to improve conductivity and simplify the construction. The device is also shown in a motor control.

8 Claims, 5 Drawing Sheets

SEMICONDUCTOR CHIP SOLDERING LAND PATTERN

BACKGROUND OF INVENTION

The present invention relates to a semiconductor chip soldering land pattern for soldering a semiconductor chip on a substrate and to a soldering method for forming a circuit.

In control circuits for various electronic equipment as used in vehicles and industrial equipment, semiconductor devices comprised of bare chips are mounted on electrode or circuit patterns formed on a substrate such as a circuit board. This obtains the desired performance of the semiconductor devices by shortening the wiring distance. This minimizes electric resistance and achieves efficiency of production processes and permits high-density mounting. Such bare chips are sealed with resin after being soldered onto the electrode or circuit patterns of the substrate.

In mounting semiconductor devices such as those bare chips on the substrate, after the conductor pattern is formed on the substrate, the entire substrate surface is coated with a solder resist to cover the conductor pattern. Then portions of the solder resist is opened to form a bare chip mounting section referred to as a land pattern for receipt of the bare chip. This opening land pattern is generally of a slightly larger size than that of the bare chip to be inserted. The clearance is generally about 0.1 mm.

However, when a conventional semiconductor chip soldering land pattern is used, at the time of the melting of solder and insertion of the bare chip the displacement of the liquid solder causes the bare chip to roll and slant. This causes the jointed chip to be displaced or inclined in and/or from the horizontal plane of the substrate surface.

Conventionally, positioning jigs formed from carbon plates have been used to prevent such displacement and inclination. These positioning jigs are formed with an opening approximately corresponding to the chip shape. When soldering, the semiconductor chip is inserted in the jig opening and is aligned for mounting on the substrate. Pressure is then applied to position and hold the solder when in the molten state. Thus, the semiconductor chip is joined onto the substrate in position without any displacement or inclination.

However, when such a positioning jig is used, the jig itself needs to be formed with high accuracy. Also and the number of jigs required is increased if different size semiconductors are to be mounted. This also increases the man-hours required in the soldering joint process. Thus the resulting cost is increased and assembly is complicated.

Therefore a principal object of the present invention is to provide a semiconductor chip soldering method and structure that places the semiconductor chip in position with high accuracy in a simple constitution and without using any positioning jigs.

SUMMARY OF INVENTION

A first feature of the invention is adapted to be embodied in a semiconductor chip mounted on a substrate The substrate has a conductive surface surrounded by an insulating surface forming a soldering land pattern for containing a molten solder interposed between said conductive surface and a facing surface of the semiconductor chip. When solidified the solder solders the facing semiconductor chip surface to the conductive surface. The soldering land pattern comprises corners spaced respectively from the four corners of the semiconductor chip bottom surface and escapes formed between the corners sufficiently outside of the respective sides of the semiconductor chip bottom surface to accept liquid solder displaced from the area between the conductive surface and the facing surface of the semiconductor chip upon placing the semiconductor chip within the soldering land pattern.

Another feature of the invention is adapted to be embodied in a control for a rotating electrical machine comprising a cylindrical open ended casing body in which the semiconductor chip and substrate are contained. The casing body has outwardly projecting, parallel ribs protruding from the surface of the casing body. The semiconductor chip and substrate are held inside of the casing body by a resin. A metallic substrate mounts the semiconductor which is a bare power control chip and, in addition, a machine control circuit.

A still further feature of the invention is adapted to be embodied in a method of forming a circuit comprised of a semiconductor chip and substrate. The method comprises the steps of forming the substrate with a conductive surface surrounded by an insulating surface forming a soldering land pattern to receive the semiconductor chip and substrate. The soldering land portion is comprised of corners spaced respectively from the four corners of the semiconductor chip bottom surface and escapes formed between the corners sufficiently outside of the respective sides of the semiconductor chip bottom surface to accept liquid solder displaced from the area between the conductive surface and the facing surface of the semiconductor chip. The soldering land pattern is at least partially filled with the liquid solder. Then the semiconductor chip is positioned within the soldering land pattern to displace at least a portion of the liquid solder into the escapes

DETAILED DESCRIPTION

Figure 1:
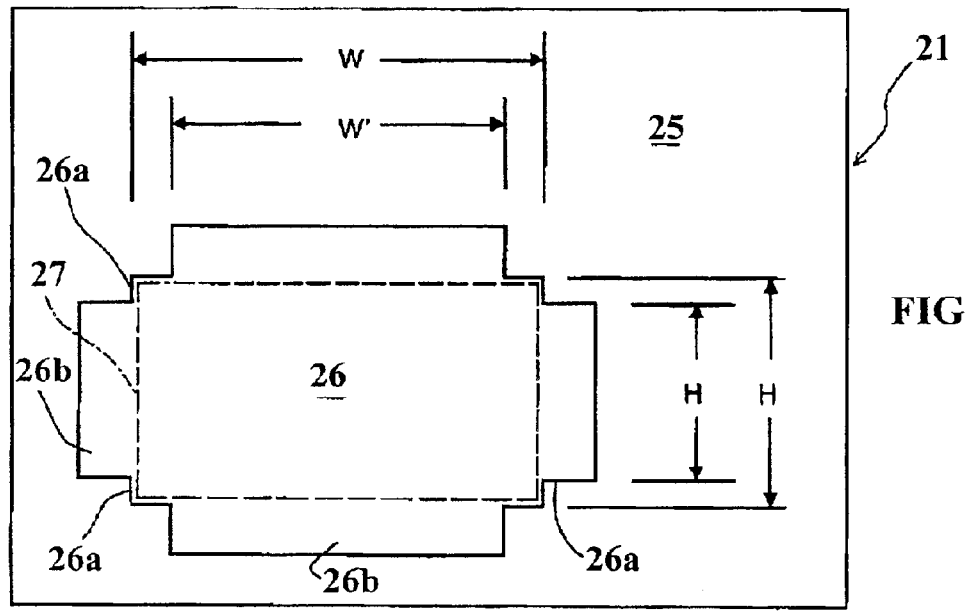
FIG. 1 is a top plan view of a land pattern constructed in accordance with an embodiment of the invention.
Figure 2:
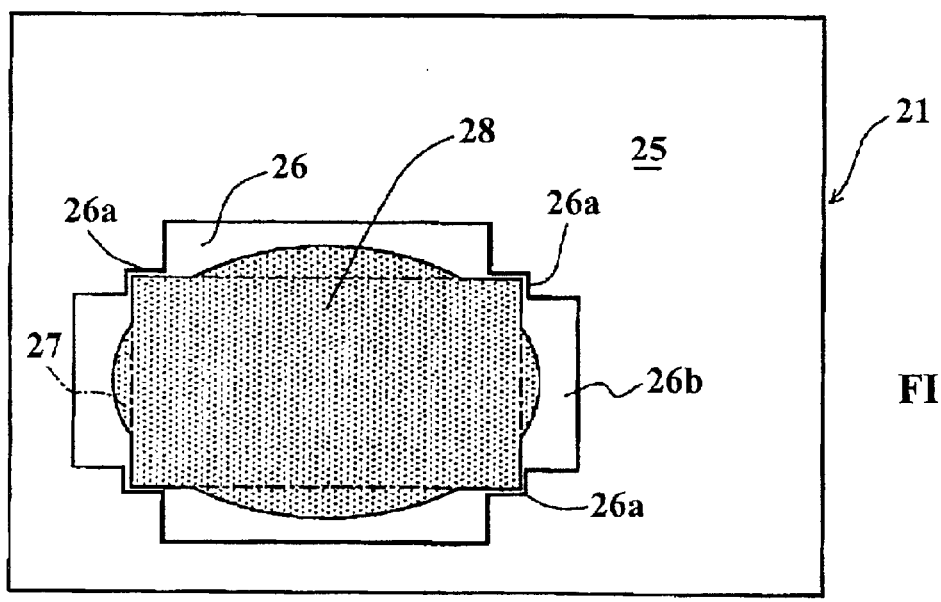
FIG. 2 is a view in part similar to FIG. 1 and shows how the molten solder is displaced upon insertion of the chip in accordance with the invention.
Figure 3:
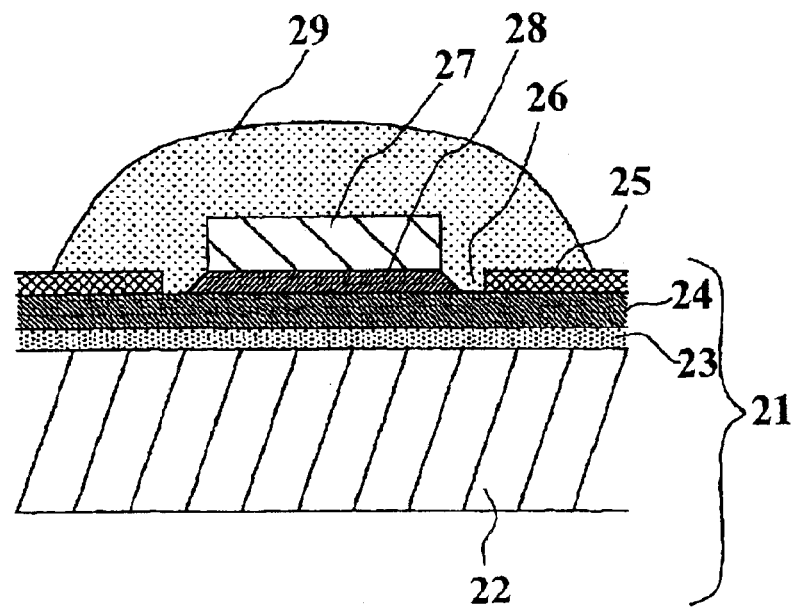
FIG. 3 is a cross sectional view taken through the center of the land pattern.

Referring now in detail to the drawings and initially to FIGS. 1–3 a circuit board on which a printed circuit and solid state components such as semiconductor chips as well as other components are mounted is shown and indicated generally by the reference numeral 21. In the above embodiment, the circuit board 21 comprises, as shown in FIG. 3, an aluminum (Al) substrate 22 of about 2–3 mm thickness, an insulating layer 23 of 75–100 µm thickness made of, for example, epoxy resin, and a conductor pattern 24 of a copper (Cu) film on the insulating layer 23.

The conductor pattern 24 is coated with the solder resist 25, which is patterned to be opened to form a land pattern 26 in the position where a semiconductor chip will be mounted. The shape of this land pattern 26 is an important feature of the invention, as will become readily apparent.

A semiconductor bare chip 27 is jointed directly by solder (eutectic solder or lead-free solder) 28 onto the conductor pattern 24 being exposed in the land pattern 26. The semiconductor bare chip 27 is, for example, a bare chip of power devices such as electric power diodes or power transistors for power conversion, through which a large amount of electric current flows.

After being soldered, the semiconductor bare chip 27 is sealed or potted by resin 29 such as epoxy. In addition, a heat sink (not shown) may be disposed on the bottom surface of the semiconductor bare chip 27 for radiating heat. The heat sink should be of roughly the same shape as the semiconductor bare chip 27. Such a heat sink is joined with the bare chip bottom surface prior to the mounting of the bare chip on the land pattern of the invention. This in effect integrates the heat sink with the bare chip.

As shown in FIGS. 1 and 2, the solder resist 25 on the substrate 21 (shown only partially) is opened to form the land pattern 26.

This land pattern 26 comprises four corners 26a roughly matching with four corners of the bottom surface (dashed line in FIG. 1) of the semiconductor chip 26 to be joined and four escapes 26b corresponding to four sides of the bottom surface. Each corner 26a matches with or slightly clears the outside of the profile of the chip bottom surface (about 0.1 mm or less). Each escape 26b projects outwardly about 1 mm from each side of the chip bottom surface. Assuming that the horizontal and the longitudinal sides of the chip bottom surface are W and H respectively, lengths of each escape 26b are shown in FIG. 1 Escape: W' on the horizontal side=0.4×W to 0.6×W, and Escape H' on the vertical side= 0.4×H to 0.6×H. Each escape is respectively aligned with the center of each side and formed in the center position of each side.

As seen in FIG. 2, in the solder joining, the molten solder 28 spreads and wets the whole chip bottom surface and then is free to flow out into the escapes 26b on four sides. The escapes 26b are sized so that the molten solder 28 flows out and stops at the middle of each escape 26b and does not spread to the whole escapes 26b. Therefore, tensile force of the molten solder 28 equally acts on the chip bottom surface from the four sides, and the chip is positioned and held in the middle of the land pattern without any deviation. Because of this action of the molten solder flowing outwardly of four chip sides, the molten solder is equally pulled in each corner 26a and reliably wets each corner of the chip 27 with solder. Thus the four corners of the chip 27 are reliably joined with solder to the conductor 24.

Furthermore, according to the land pattern of the present invention, void incidence in the melting of solder is decreased due to the increase of the solder wetting area to one greater than the area of the bottom surface of the chip 27. This phenomenon has been experimentally verified.

Because of this elimination or reduction of void incidence not only is the joint strength increase to improve the reliability of the solder joint but also good thermal conductivity is therefore obtained and heat radiation from the chip 27 to the substrate 22 is improved. Furthermore, the reduction of solder voids decreases the electric resistance of the junction surface and permits the flow large amount of electric current without any loss caused by heat generation. Thus the function of semiconductor devices can be enhanced. Particularly, when a bare chip of power elements such as electric power diodes or power transistors flowing large amount of currents for power conversion are used for the semiconductor device.

In the present invention, when the semiconductor chip is soldered to be joined, the amount of the solder for one chip is the one which reliable solder thickness necessary to joint can be obtained for the whole chip bottom surface and the molten solder can flow out in the middle of the escapes of the land pattern. Thus, the effects of the land pattern constitution of the invention of the above can be gained by appropriately selecting the amount of the solder.

Figure 4:
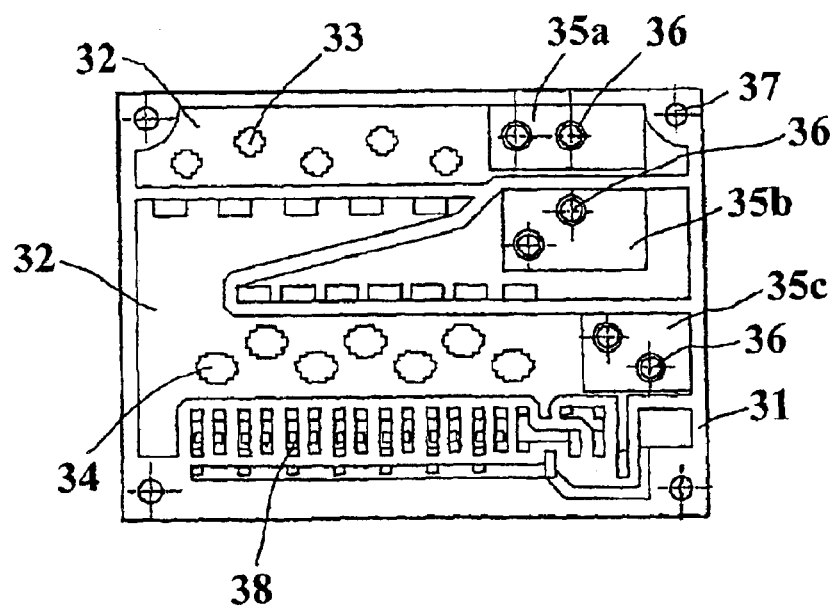
FIG. 4 is a top plan view of an aluminum substrate to which the present invention is applied.
Figure 5:
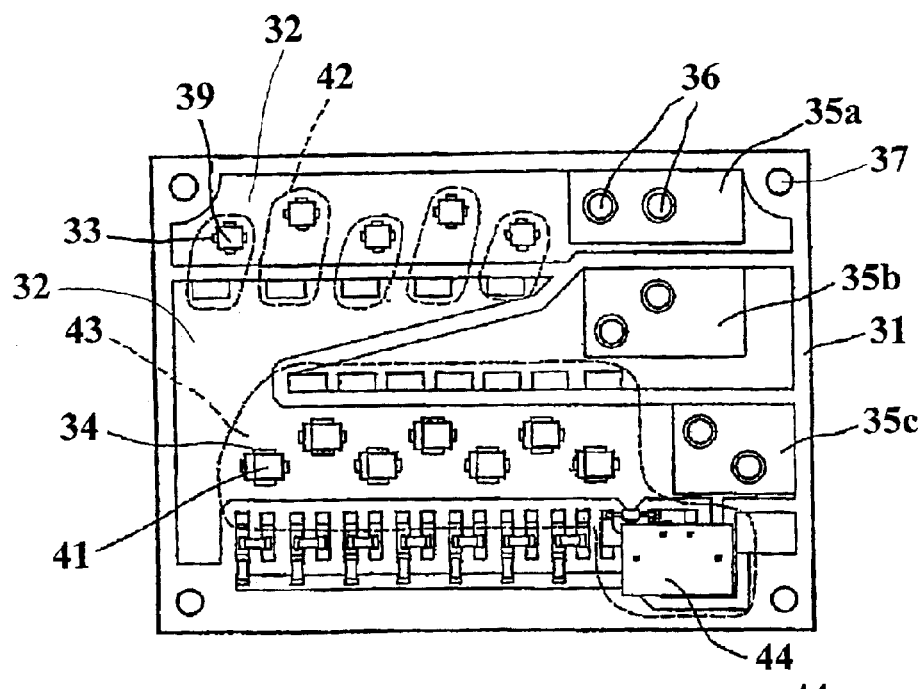
FIG. 5 is a top plan view, in part similar to FIG. 4, but showing the chips and other components mounted on the aluminum substrate.
Figure 6:
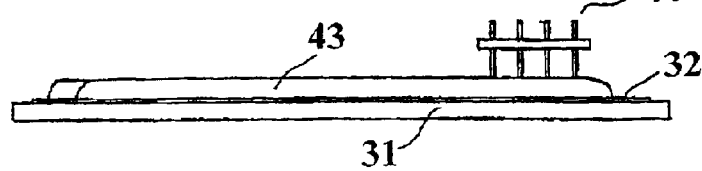
FIG. 6 is a side elevational view of the structure shown in FIG. 5.
Figure 7:
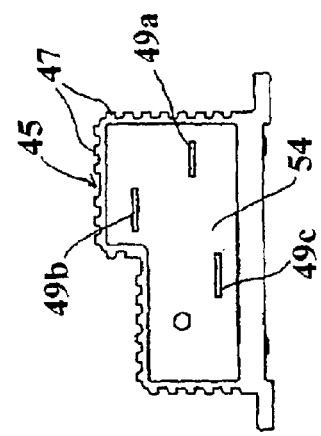
FIG. 7 is top plan view of a motor control unit for an electric-powered vehicle incorporating the invention.
Figure 8:
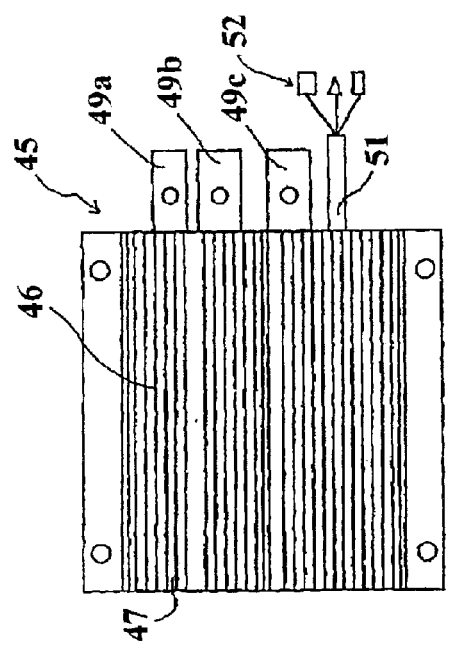
FIG. 8 is a side elevational view of the motor control unit.
Figure 9:
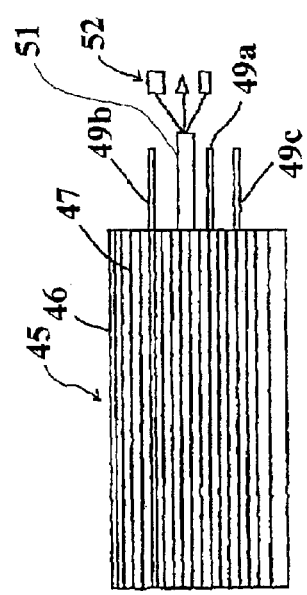
FIG. 9 is an end elevational view of the motor control unit.

FIGS. 4–6 show an embodiment where a substrate embodying the invention can be used as a motor control unit for driving an electric-powered vehicle. A conductor pattern of copper (not shown) is formed on an aluminum substrate 31 and coated with a resist 32. By patterning the resist 32, diode land patterns 33 and FET land patterns 34 constituting portions of a motor control circuit are formed. Output terminals 35a, 35b, and 35c of the control circuit are formed at three places on the aluminum substrate 31 each having two output terminal holes 36, respectively. At the four corners of the aluminum substrate 31 are disposed mounting holes 37 for fixing a casing body as will be described later by reference to FIGS. 7–12. Further on the substrate is provided a gate resistance 38 forming a further component of the drive circuit.

Diodes 39 are soldered within the respective diode land patterns 33, and FETs 41 are soldered within the respective FET land patterns 34. Each diode 39 is respectively sealed or potted with a resin 42. Each FET 41 is sealed with resin 43 along with a connector 44. A commercially available liquid sealing material or resin of linear expansion coefficient of $(15 \text{ to } 30) \times 10^{-6}/^\circ$ C. can be selected to use as the potting material for sealing such diodes 39 and FETs 41. (For example, sealing materials of linear expansion coefficient of $15 \times 10^{-6}/^\circ$ C. and $22 \times 10^{-6}/^\circ$ C. approximate to those of copper and aluminum respectively are easily available in the market.) Referring now to FIGS. 7–12, these figures show how a complete motor control unit incorporating the aluminum substrate 31 of FIGS. 4–6 can be constructed in accordance with a further feature of the invention. The motor control unit, indicated generally by the reference numeral, 45 includes a drive control circuit configured of the aluminum substrate 31 as previously described by reference to FIGS. 4–6 in a casing body 46.

The casing body 46 is formed by the extrusion of a metallic material of aluminum or aluminum alloy. The casing body 46 is of a cylindrical shape with both ends open. A plurality of aligned parallel ribs 47 are formed to project from its outer circumferential surface. The ribs 47 increase the surface area of the casing body 46, resulting in the increase of heat radiation as well as the rigidity and strength of the casing body 46.

Figure 10:
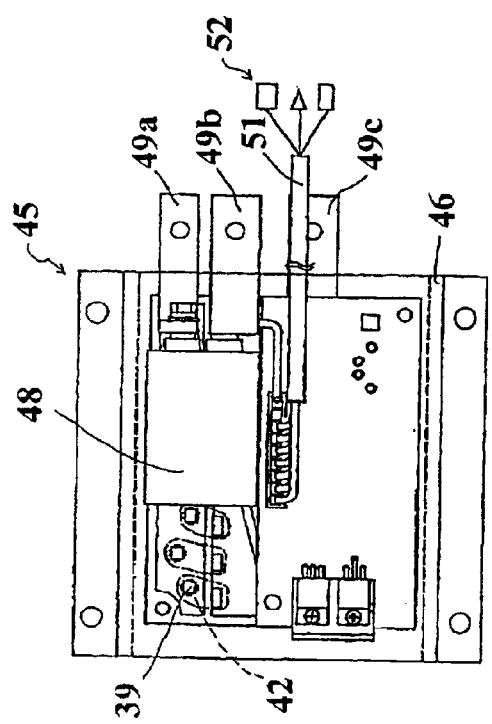
FIG. 10 is a top plan view in part similar to FIG. 7, but with the potting compound removed and showing the contained components in solid lines.
Figure 12:
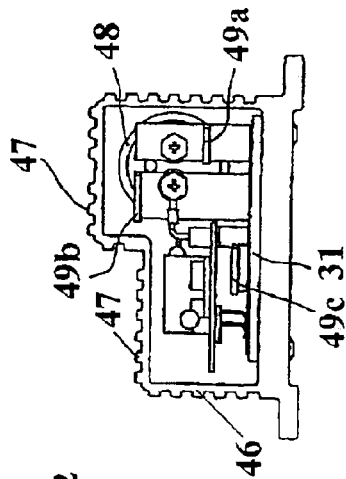
FIG. 12 is an end elevational view in part similar to FIG. 9, but with the potting compound removed and showing the contained components in solid lines.
Figure 11:
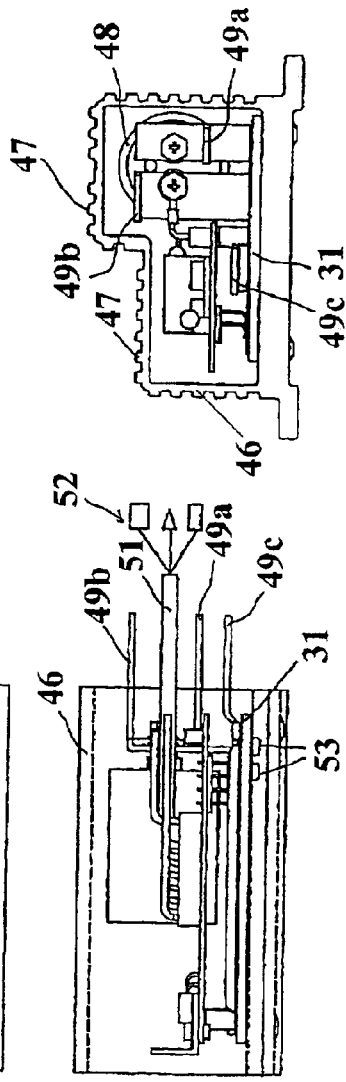
FIG. 11 is a side elevational view in part similar to FIG. 8, but with the potting compound removed and showing the contained components in solid lines.

On the aluminum substrate 31 are mounted further devices constituting a drive control circuit such as an electrolytic capacitor 48 constituting a drive control circuit (FIG. 10). Also terminal attaching plates 49a, 49b, and 49c are connecting to the aforementioned output terminals 35*a*, 35*b*, and 36*c*Each signal wire of the control circuit is connected through an electric cable 51 and a coupler 52 to switches and other drive or control parts on the vehicle side. Output terminals 53 passing through the aforementioned output terminal holes 37 project from the lower surface of the aluminum substrate 31. Such an aluminum substrate 31 and the electronic parts mounted thereon are accommodated in the casing body 46 and sealed or potted with resin 54.

As described the land pattern of the invention has escapes for molten solder so as to spread outside of each side of a semiconductor chip bottom surface at the time of soldering. The molten solder flows out to the outside of each side of the chip and the surface tension equally acts on the chip from four directions. Thus, the chip is held in position without any deviation and the reliability of the joint is increased. Moreover, since the molten solder equally flows out in the four sides, the chip is jointed parallel to the substrate surface without inclination. Furthermore, by forming the land pattern outwardly of the chip bottom surface, a void incidence is decreased. Therefore, heat radiation as well as joint strength will be increased, and the improvement in characteristics will be effected. Of course the embodiment described is a preferred embodiment of the invention and various changes and modifications may be made without departing from the spirit and scope of the invention, as defined by the appended claims.

What is claimed is:

1. A semiconductor chip mounted on a substrate, said substrate having a conductive surface surrounded by an insulating surface forming a soldering land pattern for containing a molten solder interposed between said conductive surface and a facing surface of said semiconductor chip, when solidified said solder soldering said facing semiconductor chip surface to said conductive surface, said soldering land pattern comprising corners spaced respectively from the four corners of said semiconductor chip bottom surface, and escapes formed between said corners sufficiently outside of the respective sides of said semiconductor chip bottom surface to accept liquid solder displaced from the area between said conductive surface and said facing surface of said semiconductor chip upon placing said semiconductor chip within said soldering land pattern.

2. A semiconductor chip mounted on a substrate as set forth in claim 1, wherein the escapes of said soldering land pattern are sufficiently large to permit all displaced liquid solder to flow from between said conductive surface and said facing surface of said semiconductor chip upon placing said semiconductor chip within said soldering land pattern without displacing said semiconductor chip away from said conductive surface.

3. A semiconductor chip mounted on a substrate as set forth in claim 2, wherein the escapes are disposed centrally of the respective side of the semiconductor chip.

4. A semiconductor chip mounted on a substrate as set forth in claim 2, wherein the side of each escape is parallel to the respective side of the semiconductor chip.

5. A semiconductor chip mounted on a substrate as set forth in claim 4, wherein the side of each escape is spaced about 1 mm from the respective side of the semiconductor chip.

6. A semiconductor chip mounted on a substrate as set forth in claim 1, wherein the semiconductor chip is a power device bare chip.

7. A semiconductor chip mounted on a substrate as set forth in claim 6 in combination with a rotating machine control unit, wherein the semiconductor chip controls the power of the rotating machine.

8. The combination of claim 7 wherein the rotating machine control unit comprised of a cylindrical open ended casing body in which the semiconductor chip and substrate are contained, said casing body having outwardly projecting, parallel ribs protruding from the surface of said casing body, said semiconductor chip and substrate being held inside of said casing body by a resin, a metallic substrate mounting said semiconductor bare chip and a motor drive circuit.

* * * * *